(12) United States Patent
Kim

(10) Patent No.: US 8,623,167 B2
(45) Date of Patent: Jan. 7, 2014

(54) SUBSTRATE SEALING APPARATUS AND METHOD OF SEALING SUBSTRATE USING THE SAME

(75) Inventor: Dong-Sul Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 9 days.

(21) Appl. No.: 13/444,740

(22) Filed: Apr. 11, 2012

(65) Prior Publication Data

US 2013/0000837 A1   Jan. 3, 2013

(30) Foreign Application Priority Data

Jun. 29, 2011   (KR) ........................ 10-2011-0063651

(51) Int. Cl.
| | | |
|---|---|---|
| B29C 65/00 | (2006.01) |
| B29C 45/00 | (2006.01) |
| B29C 47/00 | (2006.01) |
| B29C 43/02 | (2006.01) |
| B29C 49/00 | (2006.01) |
| B29C 51/00 | (2006.01) |
| B29C 43/10 | (2006.01) |
| B29C 55/28 | (2006.01) |
| B32B 37/00 | (2006.01) |
| B29D 24/00 | (2006.01) |
| B29D 29/00 | (2006.01) |
| B28B 21/36 | (2006.01) |
| B28B 11/08 | (2006.01) |
| A01J 21/00 | (2006.01) |
| A01J 25/12 | (2006.01) |
| A21C 3/00 | (2006.01) |
| A21C 11/00 | (2006.01) |
| A23G 1/20 | (2006.01) |
| A23G 3/02 | (2006.01) |
| A23P 1/00 | (2006.01) |

(52) U.S. Cl.
USPC ........... 156/285; 156/286; 156/382; 264/511; 264/553; 264/571; 425/504; 425/388; 425/405.1; 425/405.2

(58) Field of Classification Search
USPC .......... 156/285, 286, 104, 382; 264/511, 526, 264/553, 566, 568, 571, 101, 102, 524; 425/504, 546, 388, 405.1, 405.2, 85
See application file for complete search history.

(56) References Cited

U.S. PATENT DOCUMENTS

| 6,971,428 B2 * | 12/2005 | Eichlseder | 156/382 |
| 2003/0145943 A1 * | 8/2003 | Lee et al. | 156/285 |
| 2008/0099138 A1 * | 5/2008 | Byun et al. | 156/285 |

FOREIGN PATENT DOCUMENTS

| JP | 61-001211 | 1/1994 |
| JP | 11-100008 | 4/1999 |
| JP | 2002-318440 | 10/2002 |

* cited by examiner

Primary Examiner — Christopher Schatz
Assistant Examiner — Matthew Hoover
(74) Attorney, Agent, or Firm — Knobbe Martens Olson & Bear LLP

(57) ABSTRACT

A substrate sealing apparatus includes a chamber, at least one lower compressing member, and at least one lower compressing member. The lower compressing member includes a lower compressing surface for emitting heat, is configured to be elevated up and lowered down in a vertical direction with respect to the compressing surface, and rotates about the vertical direction. The upper compressing member includes a lower compressing surface for emitting heat, and is configured to be elevated up and lowered down in the vertical direction.

8 Claims, 8 Drawing Sheets

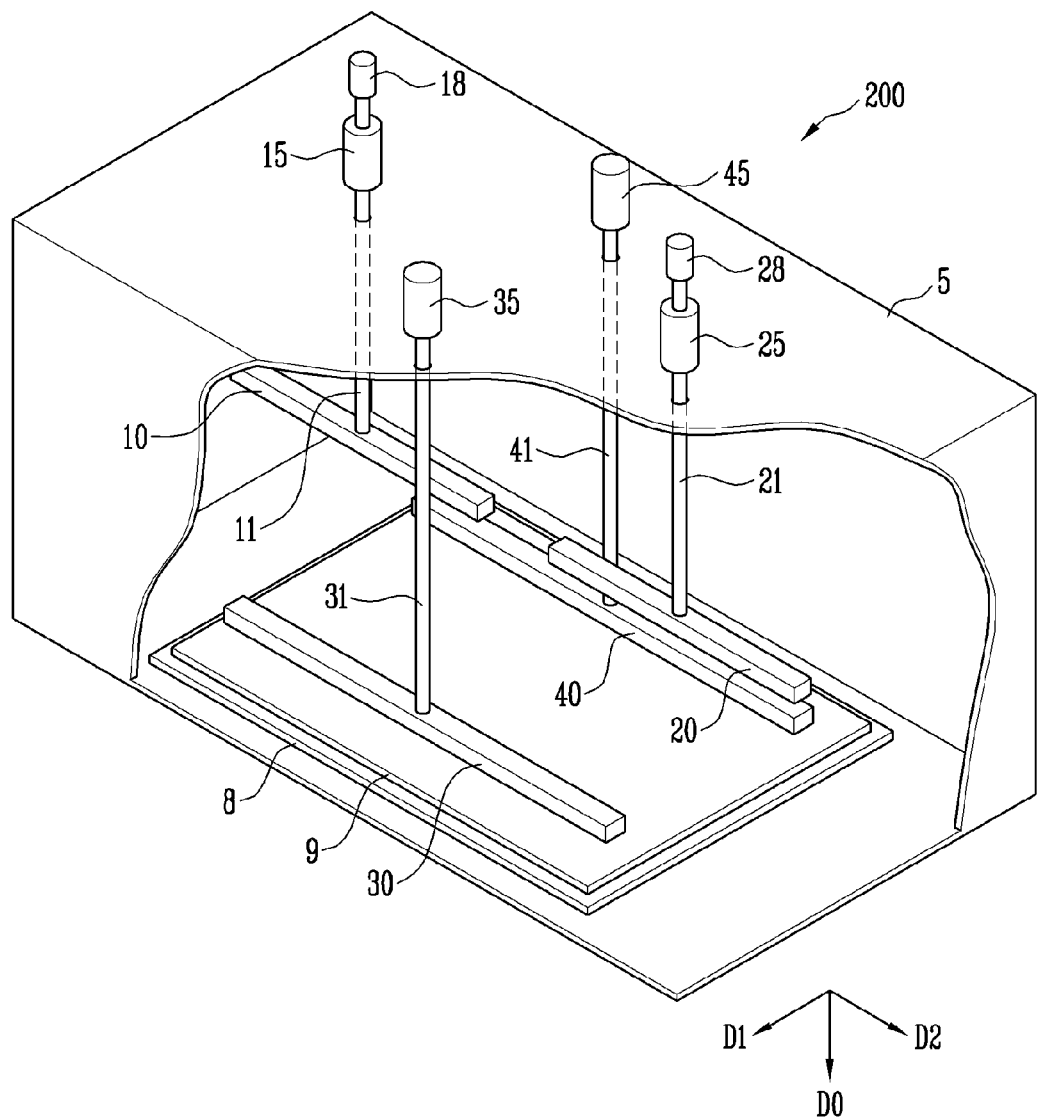

SUBSTRATE SEALING APPARATUS AND METHOD OF SEALING SUBSTRATE USING THE SAME

CROSS-REFERENCE TO RELATED APPLICATIONS

This application claims priority to and the benefit of Korean Patent Application No. 10-2011-0063651, filed on Jun. 29, 2011, in the Korean Intellectual Property Office, the entire content of which is incorporated herein by reference.

BACKGROUND

1. Field

The present disclosure relates to a substrate sealing apparatus having a simple structure and a method of sealing a substrate using the same.

2. Description of the Related Technology

Among flat panel displays (FPD), organic light emitting displays having small power consumption and excellent display quality are replacing liquid crystal displays (LCD).

In general, an organic light emitting display includes organic light emitting diodes (OLED) included in pixel regions, wherein the OLED includes a cathode electrode, an anode electrode, and an organic light emitting layer disposed between the two electrodes.

A deposition method or a laser induced thermal imaging (LITI) method is widely employed in forming the organic light emitting layer on a substrate. In the LITI method, at a vacuum atmosphere, a donor film on which an organic light emitting layer is formed is laminated on the substrate and heat is applied to the donor film to transfer the organic light emitting layer from the donor film to the substrate. Therefore, in order to correctly transfer the organic light emitting layer of the donor film to the pixel region of the substrate, before applying heat to the donor film, the substrate may be sealed with the donor film.

It is important to seal the substrate with the donor film so that the sealed part is not opened to the outside. Therefore, the donor film may be compressed using a closed loop shaped heating bar heated to a predetermined temperature. However, since the heating bar must be maintained at the predetermined temperature, an alien substance may be fixed to the heating bar so that sealing quality may deteriorate.

In order to solve the above-described problem during processes, an impulse sealing method of instantaneously making a large capacity of current flow through the bar including a high resistance material such as nichrome to generate heat has been suggested. However, the bar used for the impulse sealing method is not easily bent so that it is hard to manufacture the bar in the form of a closed loop. Therefore, many researches and developments for methods of solving the problem are conducted.

SUMMARY OF CERTAIN INVENTIVE ASPECTS

Embodiments of the present invention provide a substrate sealing apparatus for sealing a substrate with a simple structure.

Embodiments also provide a method of easily sealing a substrate using the substrate sealing apparatus.

In order to achieve the foregoing and/or other aspects of the present invention, there is provided a substrate sealing apparatus including: a chamber; at least one lower compressing member; and an upper compressing member. The lower compressing member includes a lower compressing surface for emitting heat, is configured to be elevated up and lowered down in a vertical direction with respect to the compressing surface, and rotates about the vertical direction. The upper compressing member includes an upper compressing surface for emitting heat, and is configured to be elevated up and lowered down in the vertical direction.

In order to achieve the foregoing and/or other aspects of the present invention, there is provided a method of sealing a substrate using a lower compressing member provided in a chamber and an upper compressing member provided on the lower compressing unit.

The method includes: providing a primary sealed substrate in the chamber; lowering the lower compressing member to compress the primary sealed substrate primarily; elevating the lower compressing member; rotating the lower compressing member about an axis up which the lower compressing member is elevated so as to space the lower compressing member apart from the upper compressing member in the plane; and lowering the upper compressing member to secondarily compress the primary sealed substrate.

According to embodiments of the present invention, the structure of the substrate sealing apparatus is simplified so that it is possible to reduce the number of driving shafts that pass through the chamber to drive the upper compressing member and the lower compressing member and that the chamber may be easily maintained at vacuum atmosphere.

BRIEF DESCRIPTION OF THE DRAWINGS

The accompanying drawings, together with the specification, illustrate certain embodiments of the present invention, and, together with the description, serve to explain the principles of the present invention.

FIGS. 2A to 2C are views illustrating the operations of the embodiment of a substrate sealing apparatus of FIG. 1;

DETAILED DESCRIPTION OF CERTAIN INVENTIVE EMBODIMENTS

Figure 1:
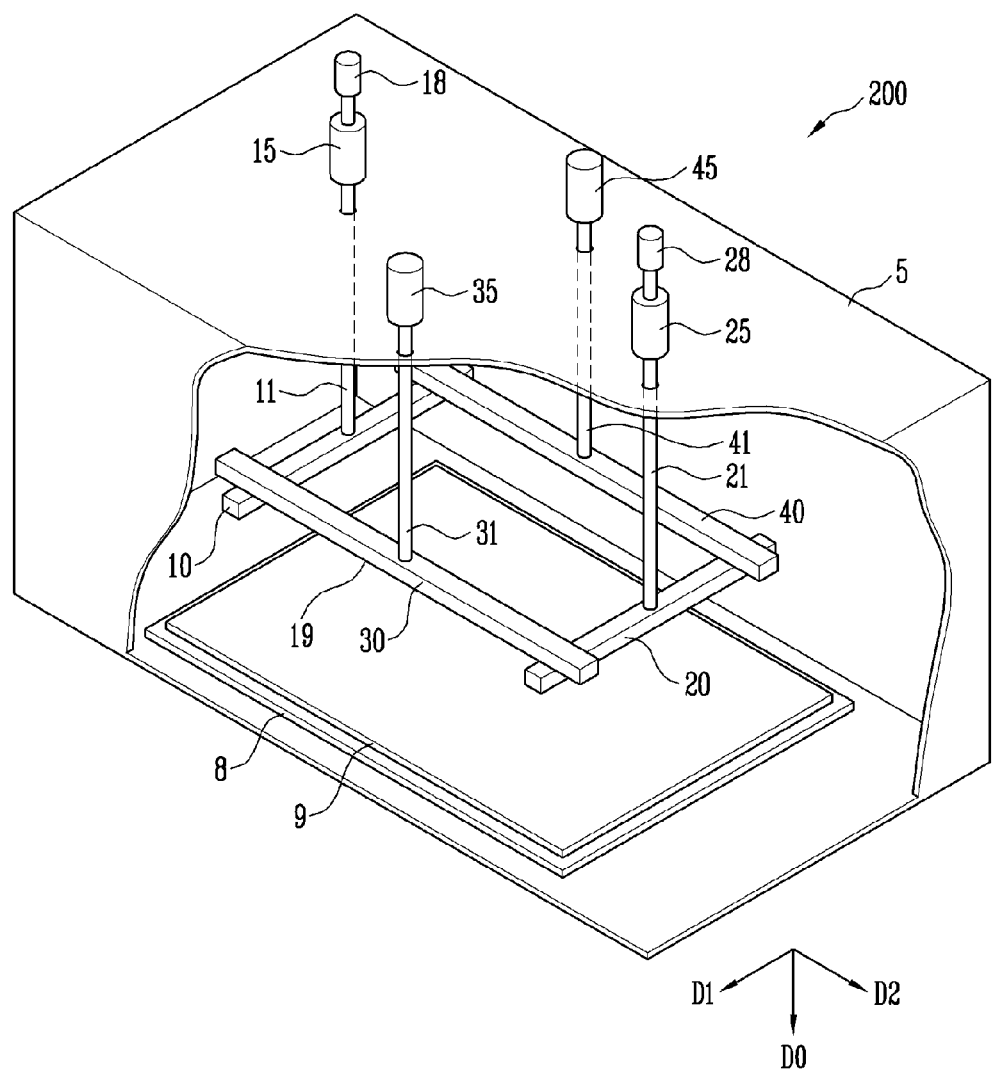
FIG. 1 is a perspective view illustrating an embodiment of a substrate sealing apparatus.

In the following detailed description, only certain embodiments of the present invention have been shown and described, simply by way of illustration. As those skilled in the art would realize, the described embodiments may be modified in various ways, without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween. Hereinafter, like reference numerals generally refer to like elements.

Hereinafter, certain embodiments of the present invention will be described in detail with reference to the accompanying drawings. The objects, characteristics, and effects of the present invention will be easily understood through the embodiments related to the attached drawings. The present invention is not limited to the embodiments described hereinafter but various modifications may exist. The following embodiments are provided to clarify the spirit disclosed by the present invention and to fully transmit the spirit of the present invention to those skilled in the art. Therefore, the claims of the present invention should not be construed as being limited to the following embodiments. The drawings disclosed together with the following embodiments are simplified or exaggerated for clarity and the same reference numerals generally denote the same elements.

FIG. 1 is a perspective view illustrating an embodiment of a substrate sealing apparatus.

Referring to FIG. 1, a substrate sealing apparatus 200 seals a substrate with a film. In some embodiments, the substrate sealing apparatus 200 may be used in processes of manufacturing an organic light emitting display. During processes of manufacturing organic light emitting displays, when an organic light emitting layer formed in a donor film is transferred to the substrate using a laser induced thermal imaging (LITI) method, the substrate sealing apparatus 200 may be used for sealing the substrate with the donor film.

The substrate sealing apparatus 200 includes a chamber 5, a lower compressing member, and an upper compressing member provided on the lower compressing member. The lower compressing member includes a first compressing unit 10 and a second compressing unit 20. The upper compressing member includes a third compressing unit 30 and a fourth compressing unit 40.

The chamber 5 has a vacuum internal space isolated from the outside. A work table 8 on which a sealed object 9 is placed may be provided in the chamber 5.

Each of the first to fourth compressing units 10, 20, 30, and 40 includes a metal, such as, for example, nichrome, that has high resistance and that is not oxidized at a high temperature and may be heated by the current supplied from the outside. Therefore, when the first to fourth compressing units 10, 20, 30, and 40 are lowered in the vertical direction D0 while being heated, the first to fourth compressing units 10, 20, 30, and 40 may heat and compress the sealed object 9.

In some embodiments, each of the first to fourth compressing units 10, 20, 30, and 40 has an elongated bar shape. In such embodiments, each of the rear surfaces of the first to fourth compressing units 10, 20, 30, and 40 may be defined as a compressing surface 19 that compresses the sealed object 9.

When sealing patterns in which the sealed object 9 is sealed by the substrate sealing apparatus 200 are opened to the outside, the effect of sealing the sealed object 9 may deteriorate. Therefore, according to some embodiments, the first and second compressing units 10 and 20 are positioned under the third and fourth compressing units 30 and 40, while the first and second compressing units 10 and 20 are overlapped with the third and fourth compressing units 30 and 40 when viewing above so that the sealing patterns may form a closed loop.

Each of the first to fourth compressing units 10, 20, 30, and 40 is elevated up and lowered down in the vertical direction D0 perpendicular to the compressing surface 19 in the chamber 5. In addition, the first and second compressing units 10 and 20 may not only move up and down in the vertical direction D0 but may rotate about the vertical direction D0. This is described in detail as follows.

The first compressing unit 10 is coupled with a first driving shaft 11 that passes through the chamber 5 and that extends to the outside of the chamber 5. The first driving shaft 11 is coupled with a first linear driving unit 15 and the first rotation driving unit 18 at the outside of the chamber 5. Then, the first compressing unit 10 may be linearly moved in the vertical direction D0 by driving the first linear driving unit 15. The first rotation driving unit 18 may be driven to rotate the first compressing unit 10 about the vertical direction D0.

In various embodiments, the first linear driving unit 15 may be implemented by a ball screw, a linear motor, or a hydraulic/pneumatic cylinder while the first rotation driving unit 18 may be implemented by a motor.

The second compressing unit 20 is coupled with a second driving shaft 21 that passes through the chamber 5 and that extends to the outside of the chamber 5. In addition, the second driving shaft 21 is coupled with a second linear driving unit 25 and a second rotation driving unit 28 at the outside of the chamber 5. Like the driving of the first compressing unit 10, the second compressing unit 20 may linearly move in the vertical direction D0 and may also rotate about the vertical direction D0.

The third compressing unit 30 is coupled with a third driving shaft 31 that passes through the chamber 5 and that extends to the outside of the chamber 5. In addition, the third driving shaft 31 is coupled with a third linear driving unit 35 at the outside of the chamber 5 so that the third compressing unit 30 may be linearly moved in the vertical direction D0 by the third linear driving unit 35.

In addition, the fourth compressing unit 40 is coupled with a fourth driving shaft 41 that passes through the chamber 5 and that extends to the outside of the chamber 5. In addition, the fourth driving shaft 41 is coupled with a fourth linear driving unit 45 at the outside of the chamber 5. Then, the fourth compressing unit 40 may be linearly moved in the vertical direction D0 by the fourth linear driving unit 45.

Operations of the substrate sealing apparatus 200 having the first to fourth compressing units 10, 20, 30, and 40 are described with reference to FIGS. 2A to 2C in detail as follows.

Figure 2A:
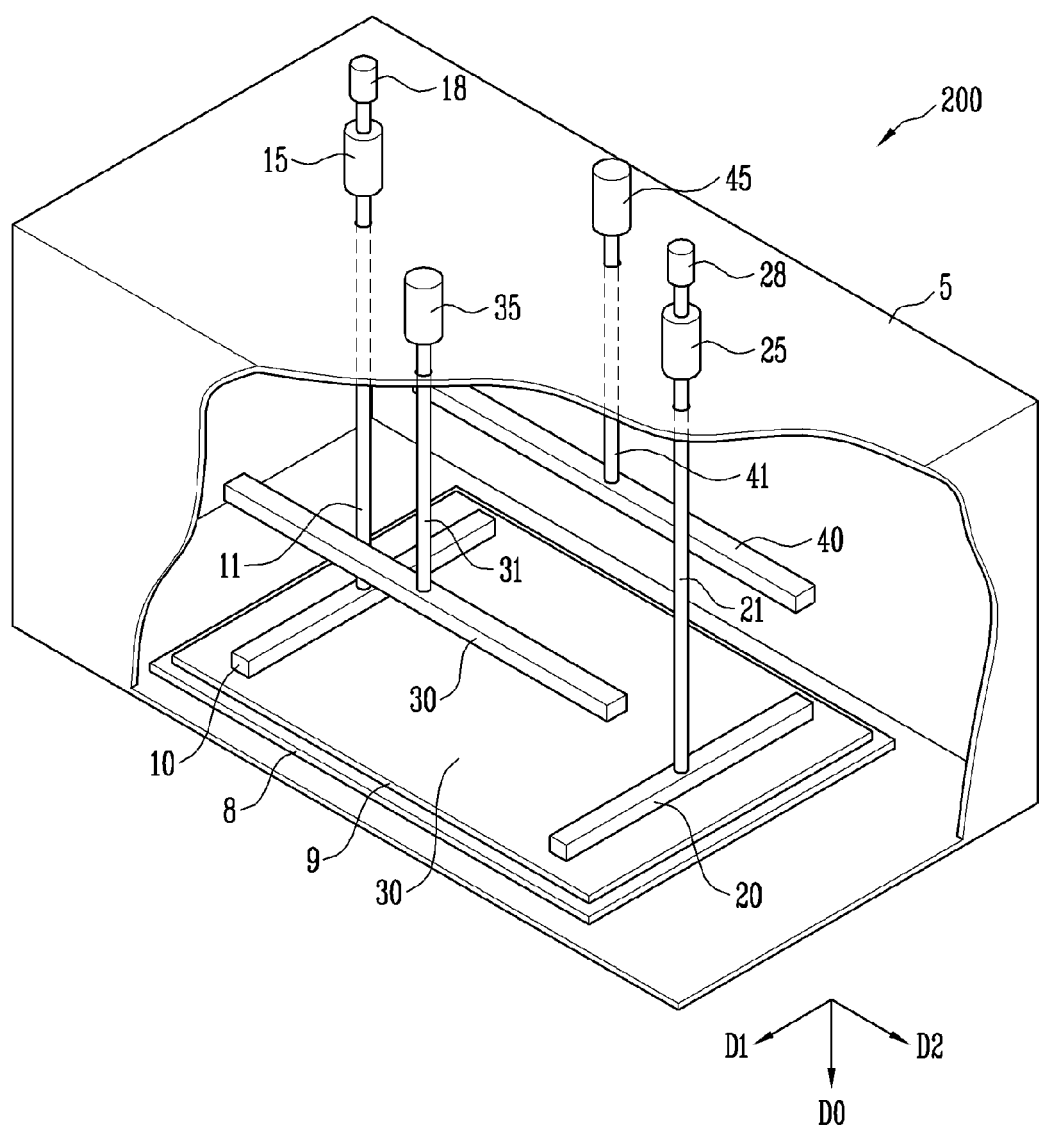
Figure 2B:
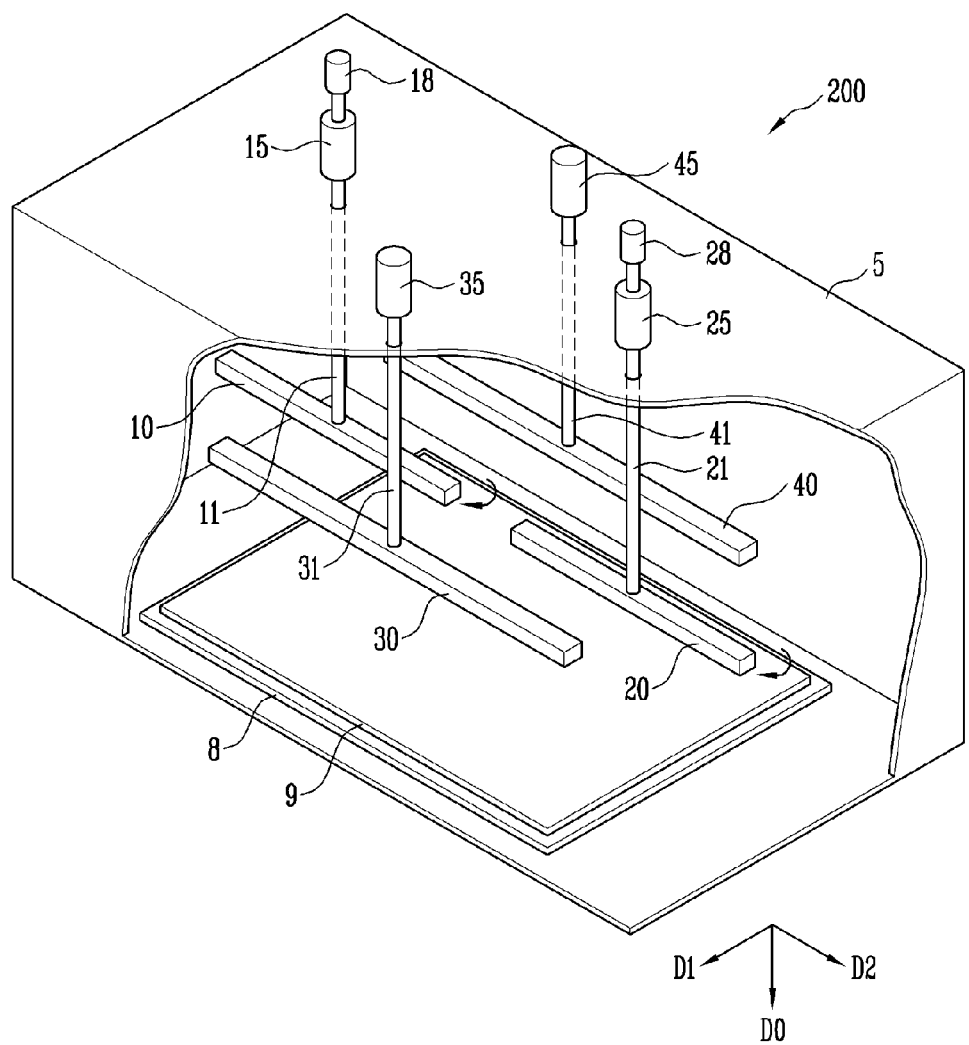

FIGS. 2A to 2C are views illustrating the operations of the embodiment of a substrate sealing apparatus of FIG. 1.

Referring to FIG. 2A, the first compressing unit 10 and the second compressing unit 20 are lowered down in the vertical direction D0 by which the first linear driving unit 15 and the second linear driving unit 25 are driven. Therefore, the first compressing unit 10 and the second compressing unit 20 may compress the sealed object 9 so that the sealing patterns parallel to a first direction D1 may be formed on the sealed object 9.

When the first compressing unit 10 and the second compressing unit 20 are lowered down, since the first and second compressing units 10 and 20 are positioned on the lower side of the third and fourth compressing units 30 and 40 even though the first and second compressing units 10 and 20 are partially overlapped with the third and fourth compressing units 30 and 40 in the plane, the first and second compressing units 10 and 20 do not interfere with the third and fourth compressing units 30 and 40.

Referring to FIG. 2B, the first compressing unit 10 and the second compressing unit 20 rotate about the vertical direction D0 by the first rotation driving unit 18 and the second rotation driving unit 28. As a result, the first and second compressing units 10 and 20 are disposed parallel to the third and fourth compressing units 30 and 40 and are spaced apart from the third and fourth compressing units 30 and 40 in the plane.

Referring to FIG. 2C, the third compressing unit 30 and the fourth compressing unit 40 are lowered down by the third linear driving unit 35 and the fourth linear driving unit 45. Therefore, the third and fourth compressing units 30 and 40 may compress the sealed object 9 so that the sealing patterns parallel to a second direction D2 may be formed on the sealed object 9.

Before the third and fourth compressing units 30 and 40 are lowered down, the first and second compressing units 10 and 20, as described with reference to FIG. 2B, rotate to be parallel to the third compressing unit 30 and the fourth compressing unit 40. Therefore, the third and fourth compressing units 30 and 40 are lowered down and do not interfere with the first and second compressing units 10 and 20 during the lowering of the third and fourth compressing units 30 and 40.

Referring to FIG. 1 again, in order for the sealing patterns formed on the sealed object 9 by the first to fourth compressing units 10, 20, 30, and 40 not to have a shape opened to the outside, the first and second compressing units 10 and 20 may be placed on a position to be partially overlapped with the third and fourth compressing units 30 and 40. In this case, the first and second compressing units 10 and 20 are separated from the third and fourth compressing units 30 and 40 such that the third and fourth compressing units 30 and 40 do not interfere with the first and second compressing units 10 and 20 during the lowering of the third and fourth compressing units 30 and 40. Therefore, in some embodiments, the first and second compressing units 10 and 20 rotate and are spaced apart from the third and fourth compressing units 30 and 40. In such embodiments, it may be convenient to prevent the third and fourth compressing units 30 and 40 from interfering with the first and second compressing units 10 and 20 during the lowering of the third and fourth compressing units 30 and 40 regardless of moving the first and second compressing units 10 and 20 to both sides of the chamber 5.

In apparatuses where the first and second compressing units 10 and 20 are moved to the sides of the chamber 5 so as to prevent interfering with the third and fourth compressing units 30 and 40, two horizontal driving shafts that are coupled with the first and second compressing units 10 and 20 and two vertical driving shafts that are coupled with the third and fourth compressing units 30 and 40 are needed. Such apparatuses may be complicated. In addition, since the number of the driving shafts passing through the chamber 5 increases, it may not be easy to maintain the vacuum atmosphere of the chamber 5.

According to embodiments disclosed herein, since each of the first and second compressing units 10 and 20 may be driven using a single driving shaft with a vertical driving unit and a rotation driving unit connected to the driving shaft, the chamber 5 has a simpler structure. In addition, the reduced number of driving shafts that pass through the chamber 5 enables to more easily maintain the vacuum atmosphere of the chamber 5.

Figure 3:
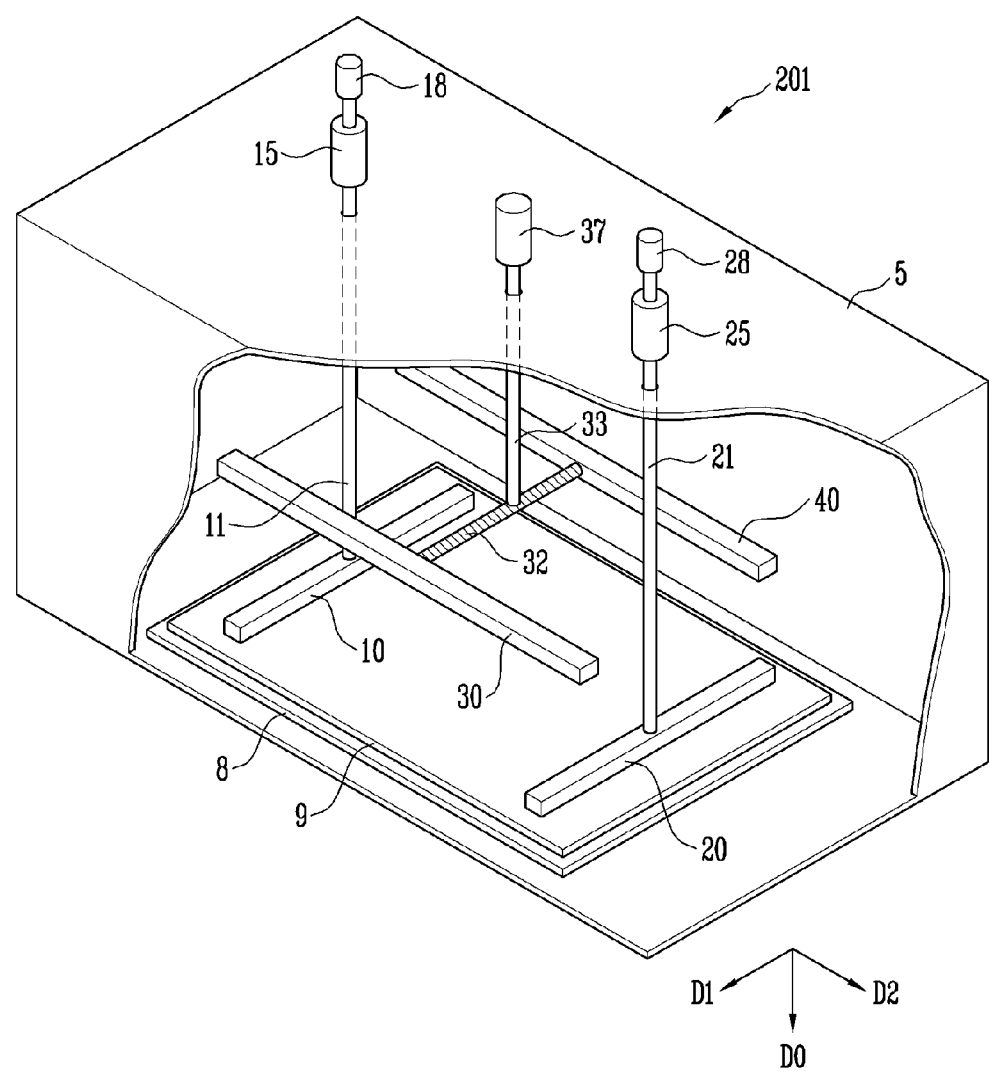
FIG. 3 is a perspective view illustrating another embodiment of a substrate sealing apparatus.

FIG. 3 is a perspective view illustrating another embodiment of a substrate sealing apparatus. In the description for FIG. 3, the description of elements with reference numerals identical to the elements described with reference to FIGS. 1, 2A, and 2C is omitted.

Referring to FIG. 3, a substrate sealing apparatus 201 includes a chamber 5, a lower compressing member, and an upper compressing member provided on the lower compressing member. The lower compressing member includes a first compressing unit 10 and a second compressing unit 20. The upper compressing member includes a third compressing unit 30 and a fourth compressing unit 40.

In the substrate sealing apparatus 201 of FIG. 3, the third compressing unit 30 and the fourth compressing unit 40 are interconnected to each other by a connecting unit 32, and the connecting unit 32 is connected to a third driving shaft 33. The third driving shaft 33 is penetrates out of the chamber 5 and is coupled with a third linear driving unit 37 at the outside of the chamber 5. Therefore, the third compressing unit 30 and the fourth compressing unit 40 may be moved linearly in the vertical direction D0 simultaneously by the third linear driving unit 37.

According to the above-described structure, since the third compressing unit 30 and the fourth compressing unit 40 are linearly moved simultaneously using the third driving shaft 33, the number of driving shafts passing through the chamber 5 may be further reduced. Therefore, the structure of the substrate sealing apparatus 201 may be further simplified and the vacuum atmosphere in the chamber 5 may be more easily obtained.

Figure 4A:
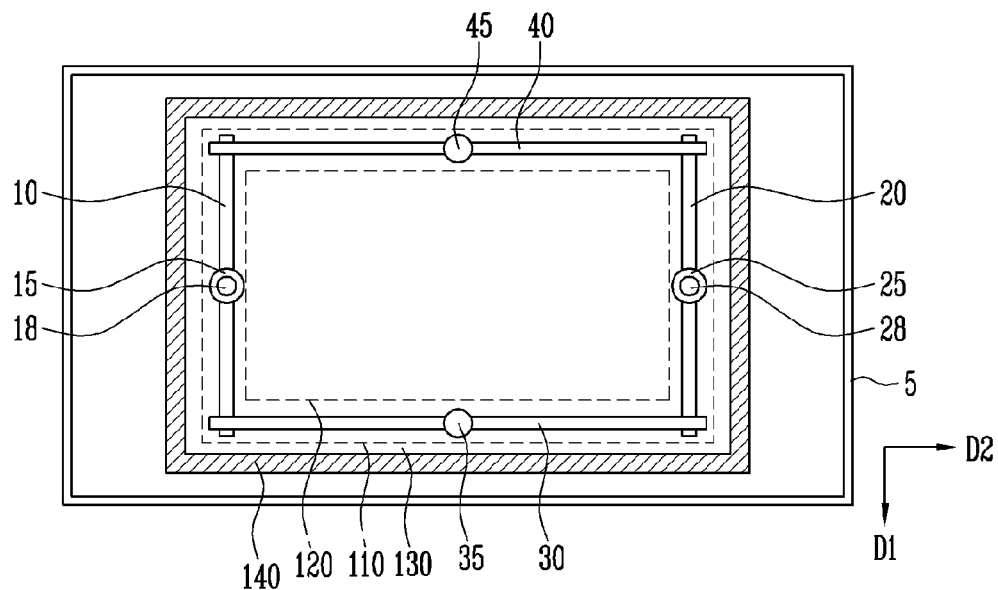
FIG. 4A is a plan view illustrating an operation of an embodiment of the substrate sealing apparatus of FIG. 1 forming a first sealing pattern on a preliminary sealing substrate.
Figure 4B:
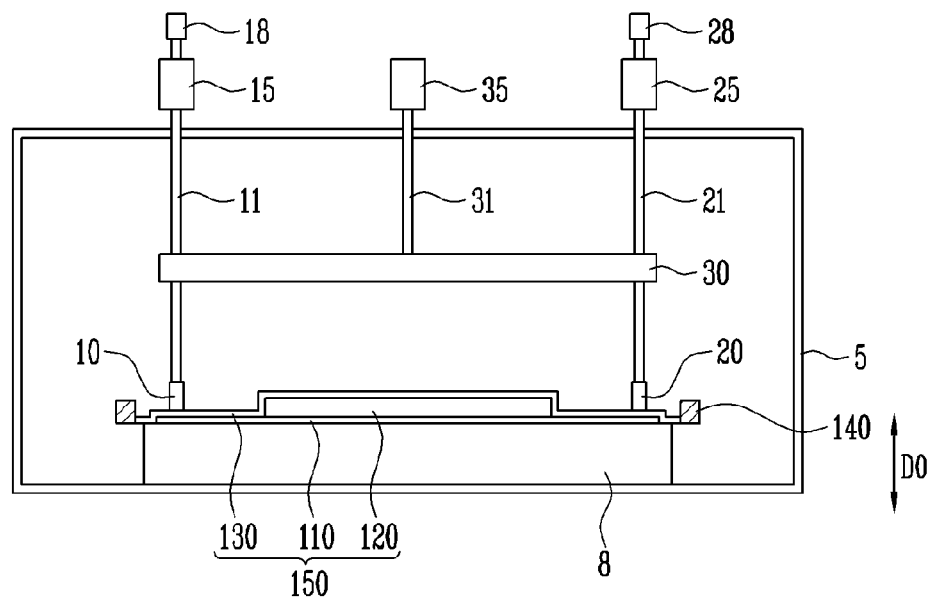
FIG. 4B is a side view of FIG. 4A.

FIG. 4A is a plan view illustrating the operations of the embodiment of a substrate sealing apparatus of FIG. 1 forming a first sealing pattern on a preliminary sealing substrate. FIG. 4B is a side view of FIG. 4A.

Referring to FIGS. 4A and 4B, a primary sealed substrate 150 is provided on a work table 8 in the chamber 5 that maintains the vacuum atmosphere. The primary sealed substrate 150 may be formed by laminating a sealing film 110 and a donor film 130 such that the sealing film 110 is under the substrate 120 and that a donor film 130 is on the substrate 120.

In some embodiments, the sealing film 110 may be a plastic-based flexible film. In some embodiments, while forming the organic light emitting layer (not shown) on the substrate 120 using the LITI method, a transferring layer (not shown) including an organic light emitting layer (not shown) may be formed on the donor film 130.

Before the sealing film 110 and the donor film 130 are compressed, the lateral sides of the donor film 130 may be drawn by a drawing device that is provided in a tray 140. Then, the donor film 130 is maintained flat so that the alignment between the donor film 130, the substrate 120, and the sealing film 110 may be stable.

Current is supplied to the first and second compressing units 10 and 20 such that the first and second compressing units 10 and 20 are heated, and the first linear driving unit 15 and the second linear driving unit 25 are driven to lower the first and second compressing units 10 and 20 in the vertical direction D0 so that the upper surface of the donor film 130 is compressed. As a result, heat and pressure supplied from the first and second compressing units 10 and 20 couple the donor film 130 and the sealing film 110 with each other so that first two sealing patterns S1 (See FIG. 5A) parallel to the first direction D1 are formed.

Figure 5A:
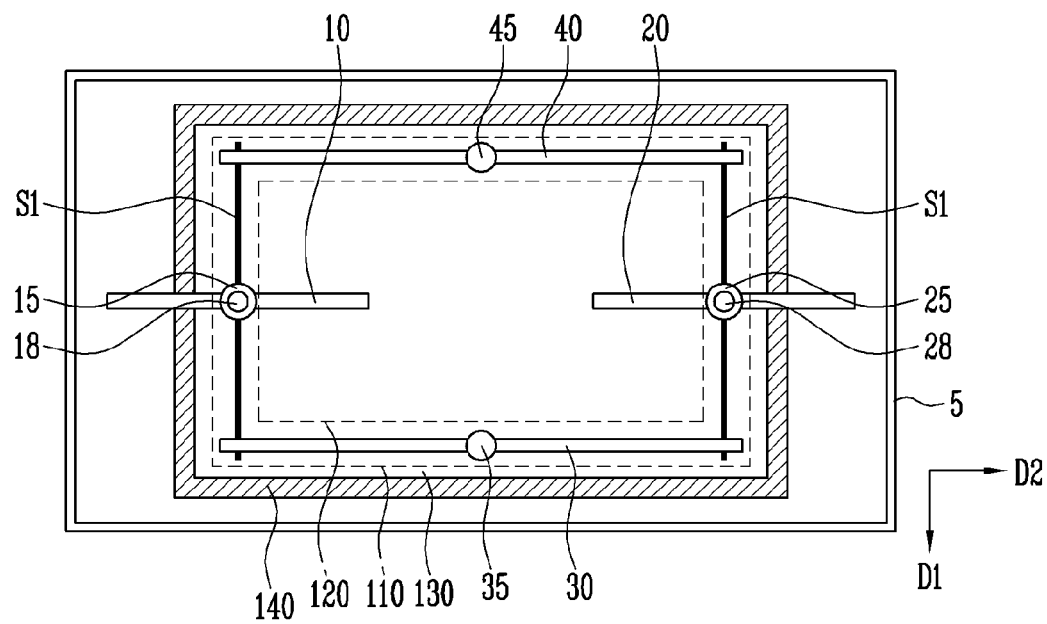
FIG. 5A is a plan view illustrating an operation of an embodiment of the substrate sealing apparatus of FIG. 1 forming a second sealing pattern on the preliminary sealing substrate.
Figure 5B:
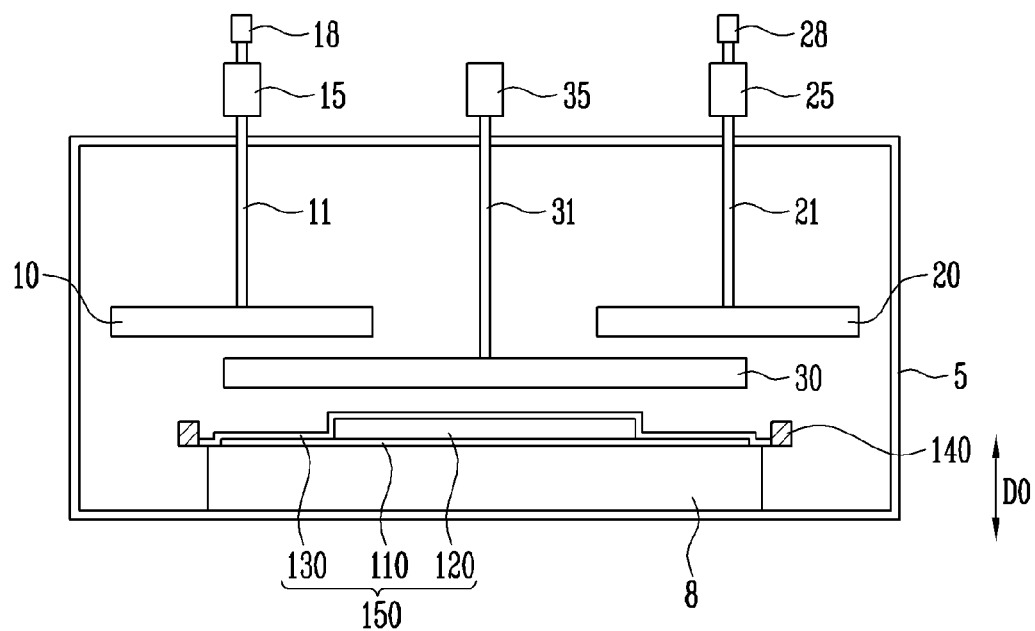
FIG. 5B is a side view of FIG. 5A.

FIG. 5A is a plan view illustrating an operation of the embodiment of a substrate sealing apparatus of FIG. 1 forming a second sealing pattern on the preliminary sealing substrate. FIG. 5B is a side view of FIG. 5A.

Referring to FIGS. 5A and 5B, after forming the first sealing patterns S1, the first and second compressing units 10 and 20 are elevated up in the vertical direction D0, and as described above with reference to FIG. 2B, the first rotation driving unit 18 and the second rotation driving unit 28 are driven to rotate the first and second compressing units 10 and 20 about the vertical direction D0. Then, each of the first and second compressing units 10 and 20 is arranged approximately parallel to a second direction D2.

The third linear driving unit 35 and the fourth linear driving unit 45 are driven to lower the third compressing unit 30 and the fourth compressing unit 40 in the vertical direction D0 such that the upper surface of the donor film 130 is compressed. As a result, heat and pressure supplied from the third and fourth compressing units 30 and 40 couple the donor film 130 and the sealing film 110 with each other so that second two sealing patterns S2 (See FIG. 6A) are formed parallel to the second direction D2.

Figure 6A:
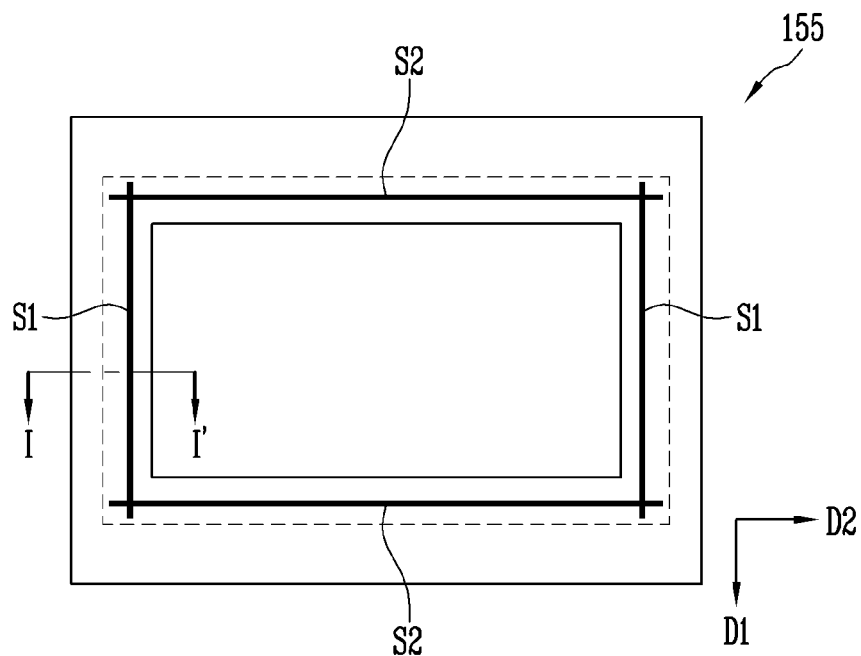
FIG. 6A is a plan view illustrating an embodiment of a sealing substrate completed by forming the sealing patterns on the preliminary sealing substrate of FIGS. 4A, 4B, 5A, and 5B.
Figure 6B:
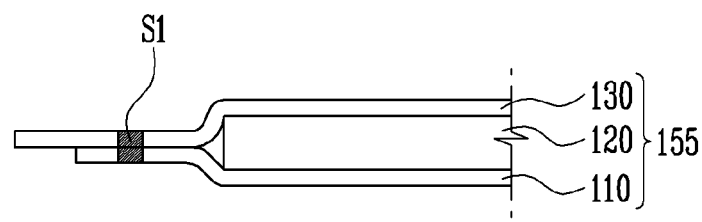
FIG. 6B is a sectional view illustrating a surface taken along the line I-I' of FIG. 6A.

FIG. 6A is a plan view illustrating an embodiment of a sealing substrate completed by forming the sealing patterns on the preliminary sealing substrate of FIGS. 4A, 4B, 5A, and 5B. FIG. 6B is a sectional view illustrating a surface taken along the line I-I' of FIG. 6A.

Referring to FIG. 6A, according to the description with reference to FIGS. 4A, 4B, 5A, and 5B, the primary sealed substrate 150 is sealed so that a sealed substrate 155 is completed. On the sealed substrate 155, the first two sealing patterns S1 extending in the first direction and the second two sealing patterns S2 extending in the second direction D2 are formed. The first sealing patterns S1 and the second sealing patterns S2 are partially overlapped with each other in the plane.

Referring to FIG. 6B, the donor film 130 and the sealing film 110 extend to a side of the substrate 120 to enclose the substrate 120, and the extending donor film 130 and sealing film 110 are combined with each other by heat and pressure so that the first sealing patterns S1 are formed.

Although not depicted in the drawings, laser is projected on the sealed substrate 155 on which the first and second sealing patterns S1 and S2 are formed so that the transferring layer of the donor film 130 is transferred to the substrate 120. As a result, the transferring layer including the organic light emitting layer is transferred to the substrate 120 on which an anode electrode (not shown) is formed so that the organic light emitting layer may be formed on the anode electrode.

While the present invention has been described in connection with certain embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of sealing a substrate using a lower compressing member provided in a chamber and an upper compressing member provided on the lower compressing member, the method comprising:

providing a primary sealed substrate in the chamber;
lowering the lower compressing member to compress the primary sealed substrate primarily;
elevating the lower compressing member;
rotating the lower compressing member about an axis up which the lower compressing member is elevated so as to space the lower compressing member apart from the upper compressing member in a plane;
and lowering the upper compressing member to secondarily compress the primary sealed substrate.

2. The method as claimed in claim 1, wherein, when the primary sealed substrate is primarily compressed, the lower compressing member is disposed parallel to a first direction such that a first sealing pattern is formed on the primary sealed substrate along the first direction of the primary sealed substrate.

3. The method as claimed in claim 2, wherein, when the primary sealed substrate is secondarily compressed, the upper compressing member is disposed in a second direction different from the first direction such that a second sealing pattern is formed on the primary sealed substrate along the second direction.

4. The method as claimed in claim 3, wherein there are a plurality of the lower compressing members and a plurality of the upper compressing members so that a plurality of the first sealing patterns and the second sealing patterns are formed on the primary sealed substrate and that the plurality of the first sealing patterns are partially overlapped with the plurality of the second sealing patterns.

5. The method as claimed in claim 3, wherein the primary sealed substrate is formed by laminating a sealing film and a donor film by interposing a substrate and each of the first sealing patterns and the second sealing patterns is defined by which the sealing film is combined with the donor film.

6. The method as claimed in claim 5, wherein the first sealing patterns are formed in correspondence with two sides extending in the first direction of the primary sealed substrate respectively, the second sealing patterns are formed in correspondence with two sides extending in the second direction of the primary sealed substrate, and the first sealing patterns are partially overlapped with the second sealing patterns in the plane.

7. The method as claimed in claim 1, further comprising supplying current to each of the upper compressing member and the lower compressing member to heat the upper compressing member and the lower compressing member.

8. The method as claimed in claim 1, wherein the inside of the chamber is under vacuum.

* * * * *